United States Patent

Shen et al.

[11] Patent Number: 5,818,316
[45] Date of Patent: Oct. 6, 1998

[54] NONVOLATILE PROGRAMMABLE SWITCH

[75] Inventors: Jun Shen, Phoenix; Saied N. Tehrani, Tempe; Eugene Chen, Gilbert, all of Ariz.

[73] Assignee: Motorola, Inc., Schaumburg, Ill.

[21] Appl. No.: 892,641

[22] Filed: Jul. 15, 1997

[51] Int. Cl.⁶ .................................................. H01H 51/22
[52] U.S. Cl. .......................................... 335/78; 335/179
[58] Field of Search ............................... 335/78–86, 124, 335/128, 177–179

[56] References Cited

U.S. PATENT DOCUMENTS

| | | | |
|---|---|---|---|
| 2,907,846 | 10/1959 | Wilhem | 335/179 |
| 3,295,023 | 12/1966 | Peras | 200/181 |
| 3,356,909 | 12/1967 | Polssek | 335/78 |
| 3,525,958 | 8/1970 | Rauterberg | 335/179 |
| 4,237,439 | 12/1980 | Nemoto | 335/179 |
| 5,216,396 | 6/1993 | Stahly | 335/78 |

*Primary Examiner*—Lincoln Donovan
*Attorney, Agent, or Firm*—Eugene A. Parsons

[57] ABSTRACT

A nonvolatile programmable switch includes first and second magnetizable conductors having first and second ends, respectively, each of which is a north or south pole. The ends are mounted for relative movement between a first position in which they are in contact and a second position in which they are insulated from each other. The first conductor is permanently magnetized and the second conductor is switchable in response to a magnetic field applied thereto. Programming means are associated with the second conductor for switchably magnetizing the second conductor so that the second end is alternatively a north or south pole. The first and second ends are held in the first position by magnetic attraction and in the second position by magnetic repulsion.

22 Claims, 1 Drawing Sheet

NONVOLATILE PROGRAMMABLE SWITCH

FIELD OF THE INVENTION

The present invention pertains to magnetic switches and more specifically to nonvolatile programmable magnetic switches.

BACKGROUND OF THE INVENTION

At the present time, programmable logic arrays (PLAs) are utilized in application specific integrated circuits (ASICs) in a large variety of applications. In most of these applications it is highly desirable that the logic devices are easily programmable and nonvolatile, i.e. maintain the logic setting even after power is removed.

A large variety of different switches are presently used in PLAs, including magnetic random access memories (MRAM), static random access memories (SRAM), and antifuses. MRAMs are relatively new and difficult to manufacture. SRAMs are relatively large and include a high number of semiconductor components so that high density arrays are difficult to manufacture and are largely unreliable. Also, SRAMs are volatile, i.e. lose memory with loss of power, so that their use is limited to only a few special applications. Antifuses can only be programmed once and do not have the flexibility of re-configuration, which greatly limits their use.

Accordingly, it would be highly desirable to provide an easily programmable nonvolatile logic device for use in programmable logic arrays.

It is a purpose of the present invention to provide a new and improved nonvolatile programmable switch.

It is another purpose of the present invention to provide a new and improved nonvolatile programmable switch which is easy to program and which can be easily reconfigured.

It is still another purpose of the present invention to provide a new and improved nonvolatile programmable switch which is relatively easy to manufacture and use.

It is a further purpose of the present invention to provide a new and improved nonvolatile programmable switch which can be fabricated in high density arrays.

SUMMARY OF THE INVENTION

The above problems and others are at least partially solved and the above purposes and others are realized in a nonvolatile programmable switch including a first magnetic conductor having a first end and a second magnetic conductor having a second end, the first and second magnetic conductors being magnetizable so that each of the first and second ends is either a north or a south magnetic pole. The first and second ends are mounted for relative movement between a first position in which the first and second ends are in contact with each other so as to complete an electric circuit between the first and second magnetic conductors and a second position in which the first and second ends are insulated from each other so as to prevent an electric circuit between the first and second magnetic conductors. The first magnetic conductor is permanently magnetized with the first end being either a north or a south magnetic pole and the second magnetic conductor is switchable in response to a magnetic field applied thereto. Programming means are associated with the second magnetic conductor for switchably magnetizing the second magnetic conductor so that the second end is alternatively either a north or a south magnetic pole. The first and second ends are held in the first position by magnetic attraction when the first end and the second end are opposite magnetic poles and in the second position by magnetic repulsion when the first end and the second end are similar magnetic poles.

Utilizing arrays of these nonvolatile programmable switches, programmable logic arrays can be fabricated.

BRIEF DESCRIPTION OF THE DRAWINGS

Referring to the drawings.

DESCRIPTION OF THE PREFERRED EMBODIMENTS

Figure 1:
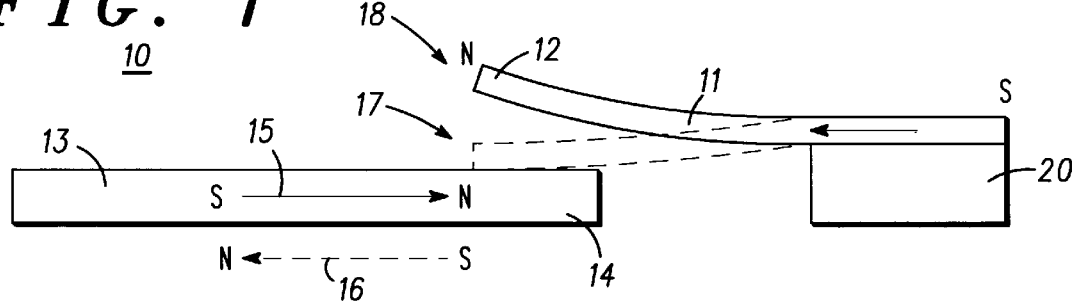
FIG. 1 is a simplified view in side elevation of a nonvolatile programmable switch in accordance with the present invention.

Turning now to the drawings, FIG. 1 illustrates in a simplified view a nonvolatile programmable switch 10 in accordance with the present invention. Switch 10 includes a magnetic conductor 11 having an end 12 and a magnetic conductor 13 having an end 14. Magnetic conductors 11 and 13 are magnetizable so that each of ends 12 and 14 is either a north or a south magnetic pole. Also, magnetic conductor 11 is permanently magnetized with end 12 being either a north or a south magnetic pole and the magnetization of magnetic conductor 13 is switchable in response to a magnetic field applied thereto. In this specific embodiment, end 12 is permanently magnetized as a north magnetic pole and magnetic conductor 13 has one magnetic state illustrated by solid arrow 15 and another state illustrated by a broken line arrow 16. Here it should be understood that magnetic conductor 11 is described as permanently magnetized because it generally remains in one magnetic orientation while magnetic conductor 13 is switchable between either of the illustrated magnetic states and remains in the selected state after power, or the magnetic field source, is removed.

Magnetic conductors 11 and 13 are mounted to allow relative movement of ends 12 and/or 14 between a position 17 (illustrated in broken lines) in which ends 12 and 14 are in contact with each other so as to complete an electric circuit between magnetic conductors 11 and 13 and a position 18 (illustrated in solid lines) in which ends 12 and 14 are insulated from each other, such as by air or some insulation material, so as to prevent an electric circuit between magnetic conductors 11 and 13. Ends 12 and 14 are held in position 17 by magnetic attraction when ends 12 and 14 are opposite magnetic poles and in position 18 by magnetic repulsion when ends 12 and 14 are similar magnetic poles. In this specific embodiment magnetic conductor 11 is affixed to a permanent mounting 20 with end 12 being cantilevered from permanent mounting 20 so as to allow generally vertical movement of end 12. Also, magnetic conductor 13 is mounted in the fixed position illustrated. It will be understood, however, that either or both ends 12 and 14 can be mounted for relative movement, according to the method of manufacture and the application of the switch.

Figure 2:
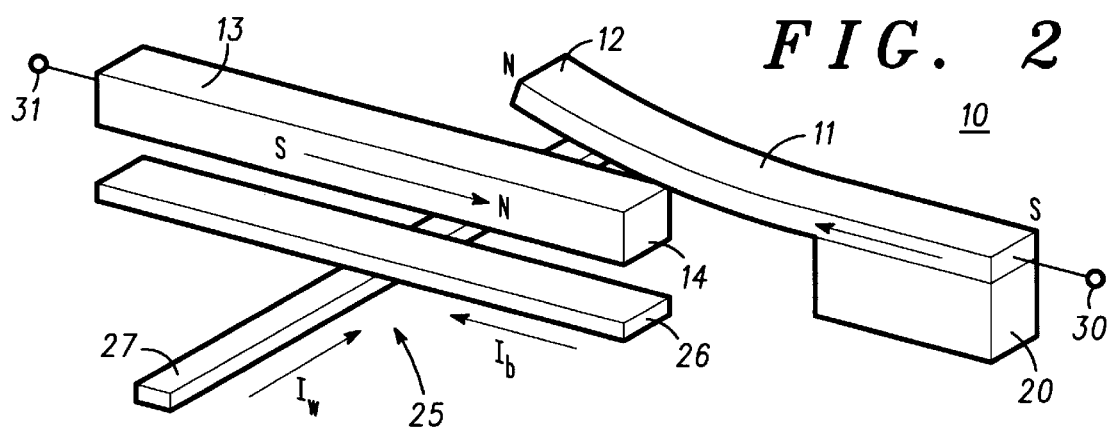
FIG. 2 is a simplified isometric view of the switch of FIG. 1 with a programming structure added.

Turning now to FIG. 2, a simplified isometric view of switch 10 is illustrated, with a programming structure 25 added. Programming structure 25 is associated with magnetic conductor 13 for switchably magnetizing magnetic conductor 13 so that end 14 is alternatively either a north or a south magnetic pole. While programming structure 25 can be any convenient magnetic field source for switching the magnetization of magnetic conductor 13 when the magnetic field source is activated, such as an inductive write head (such as used in conjunction with a hard disk) which can be moved over the array, one or more current lines, etc. in this specific embodiment programming structure 25 includes a pair of current lines 26 and 27 positioned adjacent magnetic conductor 13. Current lines 26 and 27 are, for example, write and bit lines used in conjunction with an array of logic devices.

In this specific example, switch 10 is one switch in an array of nonvolatile programmable switches positioned in rows and columns. Each of the nonvolatile programmable switches in each row is connected in series with each of the other nonvolatile programmable switches in the row by means of a terminal 30 connected to magnetic conductor 11 and terminal 31 connected to magnetic conductor 13. Here it should be understood that the terms "row" and "column" are used only for purposes of explanation and are completely interchangeable throughout this disclosure. A current line 26 is associated with each row of switches and a current line 27 is associated with each column of switches. Thus, each switch of the plurality or array of nonvolatile programmable switches is positioned at a row and column crossing with the specific current lines (e.g. 26 and 27) at the crossing being positioned adjacent magnetic conductor 13.

Each current line 26 or 27 does not carry enough current individually to produce a large enough magnetic field to cause magnetic conductor 13 to change states. Thus to address a specific nonvolatile programmable switch the unique current lines for the row and column in which the switch is positioned are selected. In this instance the combined current in current lines 26 and 27 generates sufficient magnetic field to cause the unique nonvolatile programmable switch at their juncture (and only this unique switch) to change states.

Figure 3:
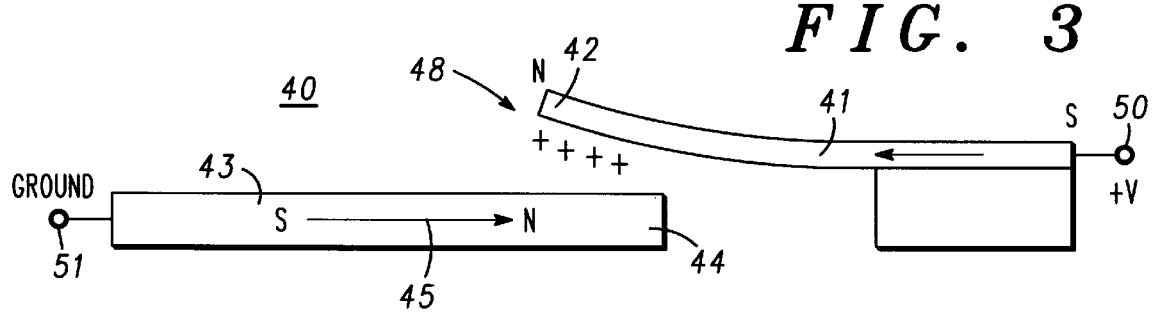
FIG. 3 is a simplified view in side elevation of a nonvolatile programmable switch illustrating a problem that can arise in some applications.

Turning now to FIG. 3, a simplified view in side elevation is shown of a nonvolatile programmable switch 40 illustrating a problem that can arise in some applications. Switch 40 includes a magnetic conductor 41 having an end 42 and a magnetic conductor 43 having an end 44. Magnetic conductors 41 and 43 are magnetizable so that each of ends 42 and 44 is either a north or a south magnetic pole. Also, magnetic conductor 41 is permanently magnetized with end 42 being a north magnetic pole and the magnetization of magnetic conductor 43 is switchable in response to a magnetic field applied thereto between one magnetic state illustrated by solid arrow 45 and the opposite state (not shown).

A terminal 50 connected to magnetic conductor 41 and a terminal 51 connected to magnetic conductor 43 are utilized to connect switch 40 into an electrical circuit designed to conduct current therethrough. However, in some applications, when switch 40 is open, as illustrated in FIG. 3, a Coulomb attractive force may be generated between ends 42 and 44. This Coulomb attractive force is produced by induced opposite charges at ends 42 and 44 by a potential appearing between terminals 50 and 51. As an example, in FIG. 3 terminal 50 is connected to a positive voltage and terminal 51 is connected to ground. When switch 40 is opened (as illustrated) a positive charge collects or builds-up at end 42 and a negative charge collects or builds-up at end 44. These opposite charges produce a Coulomb force tending to draw ends 42 and 44 together, which Coulomb force can be larger than the magnetic force tending to hold switch 40 open. Once ends 42 and 44 are drawn together the charge buildup will disappear and ends 42 and 44 are repelled by the magnetic force. If the potential is retained on terminal 51 the process will repeat and will produce a sustained oscillation, which is very undesirable.

Figure 4:
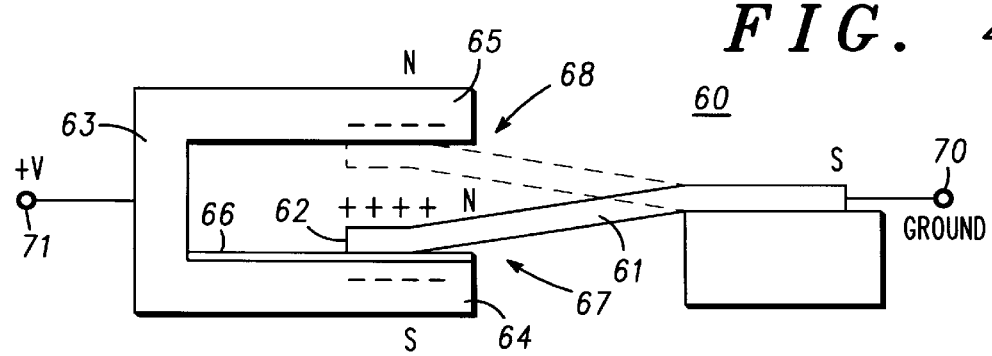
FIG. 4 is a simplified view in side elevation of a nonvolatile programmable switch in accordance with the present invention which solves the problem illustrated in FIG. 3.

Turning now to FIG. 4, a simplified view in side elevation is illustrated of a nonvolatile programmable switch 60 in accordance with the present invention which solves the problem described above in conjunction with FIG. 3. Switch 60 includes a magnetic conductor 61 having an end 62 generally mounted and magnetized as described above. A magnetic conductor 63 is generally U-shaped and has an end 64 and an end 65 with end 62 of magnetic conductor 61 positioned for movement therebetween. Also, a thin film insulator 66 is positioned on the contact surface of end 64 to prevent end 62 of magnetic conductor 61 from completing an electrical contact with the surface of end 64. Alternatively, the U-shaped conductor can be fabricated with one magnetic conducting arm and one non-magnetic conducting arm. Magnetic conductor 63 is magnetizable so that ends 64 and 65 are magnetically opposed and each is either a north or a south magnetic pole. Further, the magnetization of magnetic conductor 63 is switchable in response to a magnetic field applied thereto between one magnetic state and the opposite state. A terminal 70 connected to magnetic conductor 61 and a terminal 71 connected to magnetic conductor 63 are utilized to connect switch 60 into an electrical circuit designed to conduct current therethrough.

In this embodiment, in the "off" state, the magnetic force between ends 62, 64 and 65 attracts/repels end 62 into contact with insulator 66 (illustrated in solid lines as position 67) and no circuit is completed through switch 60. When a potential is applied between terminals 70 and 71, charges will be induced on the surfaces of both ends 64 and 65 and, thus, the Coulomb forces almost cancel each other so that the magnetic force dominates and end 62 remains in position 67. Generally, to insure a nearly equal Coulomb force, thin film insulator 66 is thinner than the separation between the upper surface of end 62 of magnetic conductor 61 and the surface of end 65 of magnetic conductor 63. Further, because of this configuration, the induced amount of charge is larger at the surface of end 64 and at the lower surface of end 62 and because end 62 is closer to end 64 the induced charge in end 62 is pointing downward. In the "on" state, the magnetic force between ends 62, 64 and 65 attracts/repels end 62 into electrical contact with the surface of end 65 (illustrated in broken lines as position 68) and a circuit is completed through switch 60.

Accordingly, an easily programmable nonvolatile logic device is provided for use in programmable logic arrays. The logic device is a new and improved nonvolatile programmable switch which is easy to program and which can be easily re-configured. Also, the new and improved nonvolatile programmable switch is relatively easy to manufacture and use and can be fabricated in high density arrays.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A nonvolatile programmable switch comprising:
   a first magnetic conductor having a first magnetic pole and a second magnetic conductor having a second magnetic pole;

the first and second magnetic poles being mounted for relative movement between a first position in which the first and second magnetic poles are in contact with each other so as to complete an electric circuit between the first and second magnetic conductors and a second position in which the first and second magnetic poles are insulated from each other so as to prevent an electric circuit between the first and second magnetic conductors, the first and second magnetic poles being moved into and held in the first position by magnetic attraction when the first magnetic pole and the second magnetic pole are opposite magnetic poles and in the second position by magnetic repulsion when the first magnetic pole and the second magnetic pole are similar magnetic poles; and the first magnetic conductor being permanently magnetized with the first magnetic pole being one of a north and a south magnetic pole, the second magnetic conductor being switchable between a first magnetic state in which the second magnetic pole is a north magnetic pole and a second magnetic state in which the second magnetic pole is a south magnetic pole in response to a magnetic field applied thereto, and the second magnetic conductor including nonvolatile magnetization which remains in a selected one of the first and second magnetic states when the magnetic field is removed.

2. A nonvolatile programmable switch as claimed in claim 1 wherein the first magnetic conductor is affixed to a permanent mounting with the first magnetic pole being cantilevered from the permanent mounting.

3. A nonvolatile programmable switch as claimed in claim 2 wherein the second magnetic conductor is included in a generally U-shaped structure with two extended arms and opposed surfaces on the arms, and the cantilevered first magnetic pole of the first magnetic conductor is positioned between the opposed surfaces.

4. A nonvolatile programmable switch as claimed in claim 3 wherein the two extended arms of the U-shaped structure both include the second magnetic conductor and one of the opposed surfaces of the U-shaped structure has a layer of insulating material positioned thereon.

5. A nonvolatile programmable switch as claimed in claim 3 wherein one of the two extended arms include the second magnetic conductor and another of the two extended arms of the U-shaped structure is formed of non-magnetic conducting material.

6. A nonvolatile programmable switch comprising:
a first magnetic conductor having a first magnetic pole and a second magnetic conductor having a second magnetic pole;
the first and second magnetic poles being mounted for relative movement between a first position in which the first and second magnetic poles are in contact with each other so as to complete an electric circuit between the first and second magnetic conductors and a second position in which the first and second magnetic poles are insulated from each other so as to prevent an electric circuit between the first and second magnetic conductors;
the first magnetic conductor being permanently magnetized with the first magnetic pole being one of a north and a south magnetic pole, the second magnetic conductor being switchable between a first magnetic state in which the second magnetic pole is a north magnetic pole and a second magnetic state in which the second magnetic pole is a south magnetic pole in response to a magnetic field applied thereto, and the second magnetic conductor including nonvolatile magnetization which remains in a selected one of the first and second magnetic states when the magnetic field is removed; and programming means associated with the second magnetic conductor for switchably magnetizing the second magnetic conductor so that the second magnetic pole is alternatively one of a north and a south magnetic pole, the first and second magnetic poles being moved into and held in the first position by magnetic attraction when the first magnetic pole and the second magnetic pole are opposite magnetic poles and in the second position by magnetic repulsion when the first magnetic pole and the second magnetic pole are similar magnetic poles.

7. A nonvolatile programmable switch as claimed in claim 6 wherein the programming means includes a magnetic field source positioned adjacent the second magnetic conductor, the magnetic field source providing the magnetic field for switching the magnetization of the second magnetic conductor when the magnetic field source is activated.

8. A nonvolatile programmable switch as claimed in claim 7 wherein the magnetic field source includes a pair of current lines positioned adjacent the second magnetic conductor.

9. A nonvolatile programmable switch as claimed in claim 8 wherein the pair of current lines positioned adjacent the second magnetic conductor include a bit line and a write line positioned at an angle to each other and separately addressable.

10. A nonvolatile programmable switch as claimed in claim 7 wherein the magnetic field source includes an inductive write head positioned adjacent the second magnetic conductor.

11. A nonvolatile programmable switch as claimed in claim 6 wherein the first magnetic conductor is affixed to a permanent mounting with the first end being cantilevered from the permanent mounting.

12. A nonvolatile programmable switch as claimed in claim 6 wherein the second magnetic conductor is included in a generally U-shaped structure with two extended arms and opposed surfaces on the arms, and the cantilevered first magnetic pole of the first magnetic conductor is positioned between the opposed surfaces.

13. A nonvolatile programmable switch as claimed in claim 12 wherein the two extended arms of the U-shaped structure both include the second magnetic conductor and one of the opposed surfaces of the U-shaped structure has a layer of insulating material positioned thereon.

14. A nonvolatile programmable switch as claimed in claim 12 wherein one of the two extended arms include the second magnetic conductor and another of the two extended arms of the U-shaped structure is formed of non-magnetic conducting material.

15. An array of nonvolatile programmable switches comprising:
a plurality of nonvolatile programmable switches each switch including
a first magnetic conductor having a first magnetic pole and a second magnetic conductor having a second magnetic pole,
the first and second magnetic poles being mounted for relative movement between a first position in which the first and second magnetic poles are in contact with each other so as to complete an electric circuit between the first and second magnetic conductors and a second position in which the first and second magnetic poles are insulated from each other so as to prevent an electric circuit between the first and second magnetic conductors, and the first magnetic conductor being permanently magnetized with the first magnetic pole being one of a north and a south magnetic pole, the second magnetic conductor being switchable between a first magnetic state in which the second magnetic pole is a north magnetic pole and a second magnetic state in which the second magnetic pole is a south magnetic pole in response to a magnetic field applied thereto, and the second magnetic conductor including nonvolatile magnetization which remains in a selected one of the first and second magnetic states when the magnetic field is removed;

the plurality of nonvolatile programmable switches being positioned in rows and columns with each of the nonvolatile programmable switches in each row being connected in series with each of the other nonvolatile programmable switches in the row; and programming means associated with the second magnetic conductor of each of the plurality of nonvolatile programmable switches for switchably magnetizing the second magnetic conductor so that the second magnetic pole is alternatively one of a north and a south magnetic pole, the first and second magnetic poles being moved into and held in the first position by magnetic attraction when the first magnetic pole and the second magnetic pole are opposite magnetic poles and in the second position by magnetic repulsion when the first magnetic pole and the second magnetic pole are similar magnetic poles.

16. An array of nonvolatile programmable switches as claimed in claim 15 wherein the programming means includes a magnetic field source positioned adjacent the second magnetic conductor of each switch of the plurality of nonvolatile programmable switches, the magnetic field source providing the magnetic field for switching the magnetization of the second magnetic conductor when the magnetic field source is activated.

17. An array of nonvolatile programmable switches as claimed in claim 16 wherein the magnetic field source includes a first current line associated with each row and a second current line associated with each column, one each of the switches of the plurality of nonvolatile programmable switches being positioned at a row and column crossing with the first and second current lines at the crossing being positioned adjacent the second magnetic conductor.

18. An array of nonvolatile programmable switches as claimed in claim 16 wherein the magnetic field source includes an inductive write head positionable adjacent to each of the second magnetic conductors of the plurality of nonvolatile programmable switches.

19. An array of nonvolatile programmable switches as claimed in claim 15 wherein the first magnetic conductor of each of the plurality of nonvolatile programmable switches is affixed to a permanent mounting with the first end being cantilevered from the permanent mounting.

20. A nonvolatile programmable switch as claimed in claim 15 wherein the second magnetic conductor is included in a generally U-shaped structure with two extended arms and opposed surfaces on the arms, and the cantilevered first magnetic pole of the first magnetic conductor is positioned between the opposed surfaces.

21. A nonvolatile programmable switch as claimed in claim 20 wherein the two extended arms of the U-shaped structure both include the second magnetic conductor and one of the opposed surfaces of the U-shaped structure has a layer of insulating material positioned thereon.

22. A nonvolatile programmable switch as claimed in claim 20 wherein one of the two extended arms include the second magnetic conductor and another of the two extended arms of the U-shaped structure is formed of non-magnetic conducting material.

* * * * *